United States Patent [19]
Golden

[11] 3,970,884
[45] July 20, 1976

[54] PORTABLE X-RAY DEVICE

[76] Inventor: John P. Golden, 5740 Warren Road, Ann Arbor, Mich. 48105

[22] Filed: Nov. 29, 1974

[21] Appl. No.: 527,970

Related U.S. Application Data

[62] Division of Ser. No. 377,741, July 9, 1973, Pat. No. 3,878,394

[52] U.S. Cl. .................................. 313/55; 313/56
[51] Int. Cl.² ......................................... H01J 35/04
[58] Field of Search .............................. 313/55, 56

[56] References Cited
UNITED STATES PATENTS
3,883,760   5/1975   Cunningham ........................ 313/55

*Primary Examiner*—Siegfried H. Grimm
*Assistant Examiner*—Darwin R. Hostetter
*Attorney, Agent, or Firm*—Thomas N. Young

[57] ABSTRACT

A portable X-ray source device for producing a selected number of uniform X-ray output pulses. The device comprises a spiral capacitor voltage generator, a transformer assembly and a cold-cathode emitter X-ray tube. The capacitor and transformer are coaxially disposed in mating sections of a cylindrical canister which is evacuated and filled with oil. The tube is disposed centrally within the capacitor and transformer for packaging efficiency. Corona suppression means are provided for preventing high voltage damage within the canister. The X-ray tube employs an emitter comprising spaced rings of woven graphite material. A spark gap trigger device including tungsten electrode strips is mounted on the outside of the canister where it can occupy the corner space of a square sheet metal housing. A slide-in battery cartridge and high power converter circuit are provided for dc operation.

7 Claims, 8 Drawing Figures

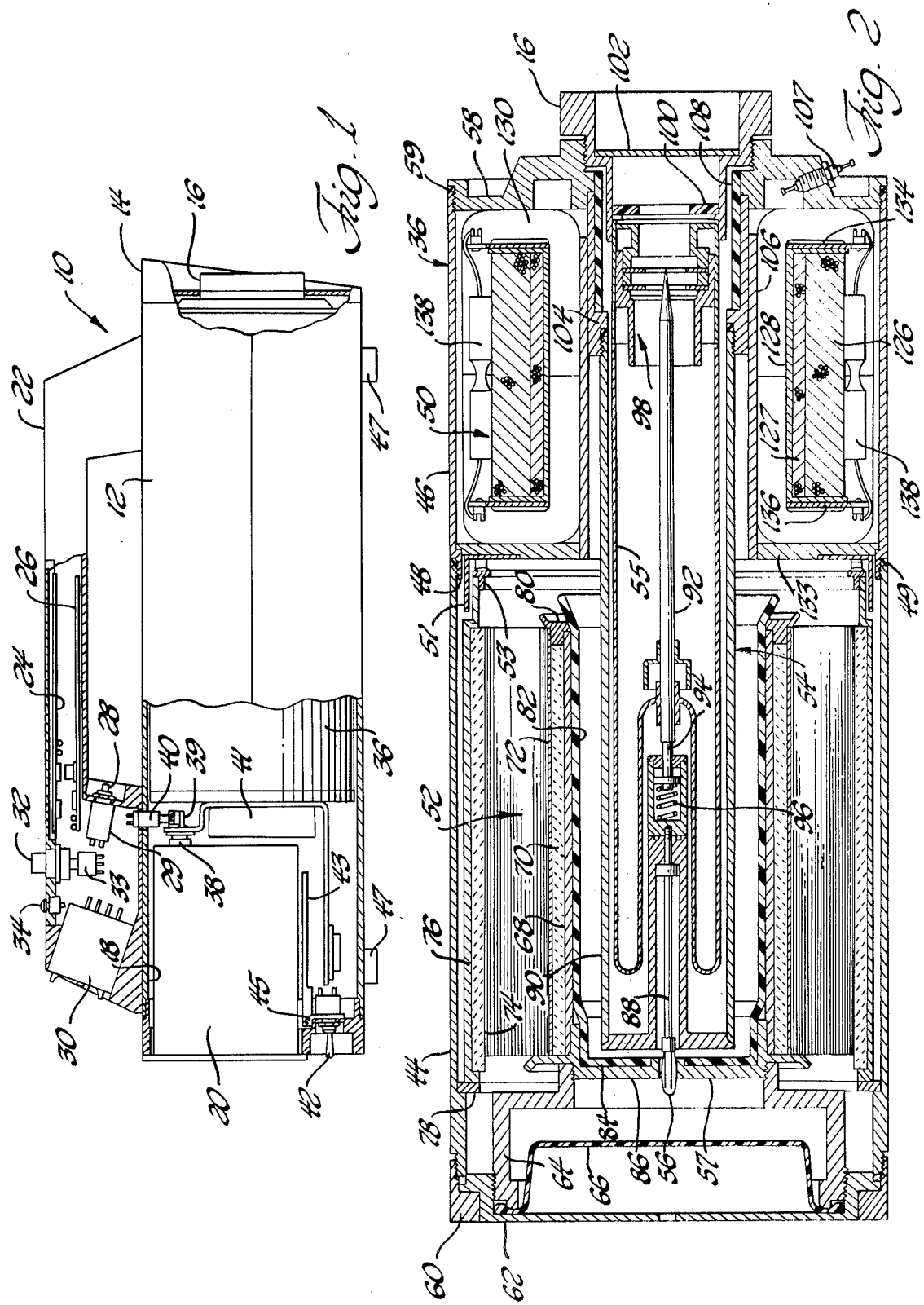

PORTABLE X-RAY DEVICE

This application is a division of United States application Ser. No. 337,741 filed July 9, 1973, for John P. Golden and entitled PORTABLE X-RAY DEVICE, now U.S. Pat. No. 3,878,398.

This invention relates to X-ray source devices and particularly to a pulsed-output X-ray device of improved design and operation. The invention further relates to improvements in certain components for X-ray source devices including transformers, triggering devices, and X-ray tubes.

BACKGROUND OF THE INVENTION

The X-ray source device to which the present invention relates is of a relatively small and often portable variety and is to be distinguished in terms of size, power output and pulsed rather than continuous wave output from the large radiology equipment typically used in hospitals for diagnostic examination of the human body. The X-ray source device to which the present invention relates is typically and particularly usable in connection with veterinarian diagnosis, concealed package examination, bomb and weapon detection systems in airports, and in any other application where a small, transportable and easily operated device is required. It may, of course, be used for examination of humans as well.

Prior art X-ray source devices of the relatively small and transportable type typically comprise an X-ray tube of the cold cathode type, a high voltage generator in the form of a spiral capacitor and a trigger device which, when actuated, applies a short duration pulse of electrical energy from the generator to the X-ray tube. Some prior art devices include means for selecting the number of output pulses to be generated during a given examination process, the number of pulses selected typically being a function of the depth and difficulty of X-ray penetration in the device being examined. A fully portable device typically comprises all of the above-named components arranged in a relatively small package having suitable protection against radiation and high voltage leakage and, in addition, a power supply including a battery and a dc to ac converter to energize the high voltage generator.

As will be understood by those familiar with the X-ray art, the X-ray source devices are usable with various types of image gathering apparatus including simple photographic plates, fluoroscopes, etc.

The small, transportable X-ray devices of the prior art present a certain number of deficiencies particularly with respect to the uniformity of the X-ray output; i.e., the pulses of electromagnetic energy are neither uniform in power level nor in distribution or pattern. In addition, the prior art devices exhibit short tube life, low efficiency, cumbersome packaging and a tendency toward internal destruction from high voltage leakage and corona effects. Thus, there exists a need for a substantially improved X-ray source device of the small transportable type so as to eliminate the numerous significant problems of the prior art.

BRIEF STATEMENT OF THE INVENTION

The subject invention is an X-ray source device of the relatively small transportable type providing a pulsed output and exhibiting improved efficiency, substantially improved uniformity of X-ray power level and distribution pattern, long component life and convenient and efficient packaging. In general, the features and advantages of the present invention are provided by the improved design of the overall X-ray source device, the improved design and construction of a number of individual components of the X-ray source device and the integration of those components into a convenient and readily usable package.

In accordance with the first more specific aspect of the present invention, a transformer of improved design and location is employed for the production of a high output voltage pulse sequence of selectable number. The transformer of the subject invention comprises a plurality of windings disposed on a dielectric bobbin or winding form, and the disposition of a relatively large number of "external", laminated steel cores around the windings of the transformer, said cores being disposed so as to enclose or surround the transformer windings at their specific locations. Further, the plurality of cores are circumferentially spaced around the windings so as to form a transformer package having a hollow center through which other components in the X-ray source device may extend. In the specific embodiment hereinafter described in detail, the cores are silicon oriented steel cores of the C design, such C sections being joined together end-for-end in pairs and bound together with plated steel bands. In addition, the transformer design of the illustrative embodiment facilitates the mounting of all output stage components including, for example, diode rectifiers, directly on the periphery of the transformer windings and between the circumferentially spaced cores thereof so as to form an integrated and unitary output unit including both primary and secondary transformer windings and other electrical components associated therewith.

As suggested above, a further feature of the invention is the location of the transformer output unit within a housing, said location being coaxial with and forward of the capacitive voltage generator, the center axis of the two devices defining an elongated space which accommodates the X-ray tube.

In accordance with a second specific feature of the invention, a high voltage generator is provided in the form of a spiral capacitor. The capacitor comprises a combination of two copper foil plates which are separated from one another by suitable dielectric material, such as Mylar and paper, and wrapped in a spiral fashion on a suitable form so as to be connectable to the transformer for the application of high voltage pulses to the X-ray source tube. In accordance with the present invention, the spiral capacitor and the aforementioned transformer are disposed together in a coaxially and axially spaced fashion within a metallic canister which is electrically maintained at ground potential and which comprises two open cylindrical sections adapted to be joined by means of a threaded connection whereby the disengagement of the two metal sections results in the electrical disconnection of the spiral capacitor from the transformer.

In accordance with a third specific feature of the invention, an X-ray source tube of the cold cathode type is provided. The X-ray source tube of the subject invention comprises, in the preferred form, an elongated and sharp pointed tungsten anode mounted in an evacuated glass envelope of the reentry type to avoid arcing between the electrodes thereof, and a cathode emitter of annular design. The emitter comprises one or more axially spaced annuli of high resistance fabriclike material disposed adjacent, concentric with, but spaced from the pointed end of the tungsten anode. In the illustrative form of the invention hereinafter described in detail, the cathode emitter comprises two annuli of graphite fabric material held together in a press-fit, two-part cathode assembly housing, the two annuli of graphite cloth material having central apertures of varying diameter in conformity with the varying diameter along the axis of the pointed anode thereby to provide uniform spacing between the interior diameters of the several emitter annuli and the anode surface.

The subject invention also comprises a method and apparatus for forming the cathode assembly as described above, said apparatus comprising a two-part, press-fit cathode assembly housing, a punch, and a Teflon block or equivalent for use during the punching operation. In the illustrative embodiment described hereinafter, the cathode assembly comprises a first housing portion of generally cylindrical configuration having a flange of enlarged diameter so as to define an internal step and a retainer ring which is press-fit into the first portion to sandwich one or more graphite cloth wafers which have been precut to the internal diameter of the stepped portion of the cathode housing. A Teflon or equivalent backup block is then placed against one side of the now peripherally secured graphite cloth wafers and a punch having a circular blade is driven through the cathode housing and the graphite cloth wafer to remove an interior circular area of predetermined diameter.

A still further feature of the present invention involves the design and location of an improved spark gap trigger device for automatic generation of the voltage pulses by discharge of the spiral capacitor when a predetermined charge level is reached. Whereas in the prior art devices the spark gap trigger device is typically located remotely from the spiral capacitor and connector therewith by way of leads, the spark gap trigger device of the present invention is disposed on the external surface of the aforementioned metal canister which holds the spiral capacitor and transformer assembly. In the preferred embodiment hereinafter described, an opening is cut or otherwise formed in the cartridge at a point which is external of the spiral capacitor, and one foil plate of the capacitor is connected to tungsten electrode on the interior of the spark gap trigger device. The opposite tungsten electrode is secured through a bracket and cap assembly to the canister and is, thus, at ground potential. To provide packaging efficiency, the spark gap trigger device is mounted on the external surface of the cylindrical cartridge and the cartridge is located within a square or rectangular housing in such a fashion as to place the trigger device in an otherwise vacant corner volume of the housing. The trigger device of the present invention is completely self-triggering and, thus, responds solely to a predetermined voltage or charge having been attained in the capacitor and does not require the use of active semiconductor devices, such as SCR's and transistors.

The present invention comprises a number of still further features and advantages, which together with those briefly described above, give rise to a vastly-improved product having vastly-improved performance and long life. These features and advantages will be hereinafter described in specific detail but for the present, suffice it to say that such advantages include but are not limited to the mounting of the spiral capacitor within the metal container in such a fashion as to eliminate corona discharge possibilities and the resulting destruction of interior components, the cantilevered relationship between a dielectric voltage shield and the cylindrical form on which the spiral capacitor is wound, a novel packaging concept involving a unique housing and handle design, a slideout battery cartridge including terminals in the cartridge and a spring-loaded door which is automatically closed upon removal of the battery cartridge, and the inclusion of a variable pulse initiation delay feature so as to permit the operator to physically remove himself from the unit before the X-ray pulses are generated.

These and other advantages of the present invention will be best understood from a reading of the following description of the specific embodiment of the invention, this specification to be taken with the accompanying drawings hereinafter briefly described.

BRIEF DESCRIPTION OF THE DRAWINGS

FIG. 1 is a side view, with parts broken away, of a portable X-ray source device embodying the various features and advantages of the present invention;

FIG. 2 is a side view, in full section, of the internal components and the metallic canister of the device of FIG. 1;

DETAILED DESCRIPTION OF THE SPECIFIC EMBODIMENT

FIG. 1

Figure 3:
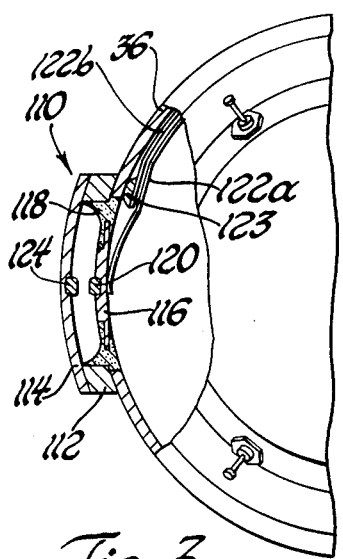
FIG. 3 is an end view, partially sectioned, of the apparatus of FIG. 2 showing the details of the spark gap trigger device and the location thereof on the canister.

Referring to FIG. 1, the invention is shown to be embodied in a small, low power, pulsed output portable X-ray source device 10 comprising a metallic housing 12 having a substantially square or rectangular cross section and preferably being fabricated out of sheet aluminum or the like. Housing 12 is fitted on the right-hand end thereof as seen in FIG. 1 with a shallow hood 14 within which is disposed an X-ray tube housing cap 16 through which the X-rays are directed during operation of the device. The housing 12 has formed in the left-hand end thereof a receptacle 18 within which is slidably disposed a battery cartridge 20 such that the X-ray source device 10 may be operated on dc power in a portable mode. The housing 12 is provided with a sturdy carrying handle 22 which is suitably secured to the housing and which, in the illustrative embodiment, carries a number of the electronics components which are involved in the timing and control of the X-ray output pulses.

Looking more specifically to the interior details of the handle 22 as revealed in the broken-away portion of the view of FIG. 1, the longitudinal portion of the handle is hollowed out to receive a pair of elongated circuit boards 24 and 26 which carry the timer and pulse counter electronics components, including resistors, capacitors, transistors, and the like. In addition, the handle carries on the interior thereof a semiconcealed start switch 28 having an interior terminal portion 29 which is wired to the circuit boards 24 and 26 by conductor means, not shown. The handle 22 further carries an exposure control device 30 including two thumbwheel switches and a suitable digital indicator for selecting the number of pulses to be generated between one and ninety-nine in accordance with the depth and difficulty of penetration of the device or article to be examined. Again, the pulse counter control is a prior art device and will not be described in great detail, other than to say it is suitably interconnected with the electronics components on the circuit boards 24 and 26.

Additionally, handle 22 carries a delay selector 32 having an interior terminal portion 33 and which may be actuated by the operator to select a delay period up to one minute between the depression of switch 28 and the X-ray pulse generation so as to enable the operator to remove himself from the X-ray area when such precautions appear to be advisable due to the nature of the device being X-rayed. More specifically, it is well known that some explosive devices may be contrived in such a fashion as to be detonated by X-ray examination and, accordingly, for the safety of the individuals performing the examination, the delay 32 permits these individuals to retire to a safe distance before the output pulses are generated. Finally, a safety lamp 34 is provided in the top of the handle 22 to indicate that power to the device has been turned on.

In the interior of the housing 12 there is disposed a cylindrical canister 36 hereinafter described in greater detail with reference to FIG. 2. The canister 36 contains the principal electronic parts of the X-ray source device including the high-voltage generator, the high-voltage transformer, and the X-ray tube as hereinafter described. The canister 36 terminates at the right-hand end thereof in the tube housing cap 16 and is suitably secured within the housing 12 by such support means as will be readily apparent to those skilled in the art.

An electrical connector 38 is disposed on the innermost end of the battery cartridge 20 and is adapted to make contact with a low-voltage transformer connector 39 which interconnects the dc power from the battery cartridge 20 to the timer and counter electronic circuit boards 24 and 26 through the terminal device 40 and to the high-voltage transformer within the canister 36 through the low-voltage transformer 41 and other circuitry hereinafter described.

As also shown in FIG. 1, housing 12 is provided at the left-hand end thereof as shown in FIG. 1 with a mode select switch 42 which operates to select either ac or dc power operation for the device 10. As also shown on the lower left-hand end of FIG. 1, a door 43 is pivotally disposed within the battery cartridge receptacle 18 and is spring biased to pivot around point 45 to a closed condition whenever the cartridge 20 is slidably removed from the receptacle 18. Conversely, when the cartridge 20 is slidably disposed in the receptacle 18, the door 43 simply pivots into the position shown in FIG. 1 where it is out of the way of the cartridge 20.

Finally, the housing 12 is provided with feet 47, made of a resilient material such as high-density rubber, so that the device 10 may be conveniently placed on a support surface, such as a table top, without damage either to the housing 12 or to the support surface.

FIG. 2

Looking now to FIG. 2, the internal details of the canister 36 and the interior components of the X-ray source assembly will be described in detail. As shown in FIG. 2, the canister 36 comprises hollow, cylindrical sections 44 and 46 of which section 46 is provided with a threaded interior collar 48 to engage an internally threaded portion of the section 44 so that the two sections 44 and 46 may be screwed together and apart as desired. An O-ring seal 49 is disposed between the two sections 44 and 46, such that the entire interior of the canister 36 may be evacuated and filled with oil and sealed.

As hereinafter described in detail, joining the canister sections 44 and 46 serves to make an electrical connection between a high-voltage, transformer output unit 50 and a spiral capacitor 52 which operates as the high-voltage generator. Both the output unit 50 and the spiral capacitor 52 are disposed within the sealed canister 36, the output unit 50 being within the cylindrical section 46, and the spiral capacitor 52 being within the cylindrical section 44. To make the high voltage connection between units 50 and 52, the output unit 50 carries an annular high-voltage contact 51 which engages a ring 53 on the spiral capacitor 52 when the canister sections 44 and 46 are fully screwed together. The ring 53 is electrically connected to the high-voltage plate of the capacitor 52 for charging the same.

Discussing the assembly of FIG. 2 in greater detail, the output unit 50 and spiral capacitor 52 are disposed within canister 36 in coaxial, but axial spaced relationship, and are both of such a configuration as to provide a continuous, hollow interior volume within which is disposed an elongated cylindrical X-ray tube 54 having a reentry-type glass envelope 55. Tube 54 receives at the left-hand end thereof a high-voltage contact 56 which is disposed through a corona suppresser member 57 and connected to the high voltage plate of the spiral capacitor 52.

On the right-hand side of the assembly of FIG. 2 the canister section 46 is shown terminating in an annular end plate 58 which is threadedly engaged with the tube housing cap 16, as shown. In addition, an O-ring seal 59 is disposed between the threadedly engaged portions of the canister section 46 and the end plate 58 to maintain the oil seal, previously described. At the left-hand end, the canister 36 is provided with an external retainer ring 60 which threadedly engages the canister portion 36 and a rear cover plate 62 which, together with a high-voltage cantilever support member 64, holds in place a resilient diaphragm 66 to accommodate expansion and contraction of the oil within the canister 36 with varying temperature conditions. The significance of this last point involves the fact that it is essential to evacuate the interior of the canister 36 before use, such that no air bubbles remain trapped in the oil, since the presence of such air bubbles could contribute to corona discharge and eventual destruction of the interior components of the device. The diaphragm 66, thus, operates in the manner of a bellows to accommodate the varying volume of the oil in the presence of temperature changes.

The spiral capacitor 52 comprises a metallic mounting cylinder 68 upon which is disposed a plurality of circumferentially spaced inner ferrite strips 70 and a plastic or other dielectric cylindrical form 72 upon which are wound in parallel, interleaved fashion two mutually insulated copper foil strips separated from one another by layers of Mylar and paper. In the specific embodiment shown in FIG. 2, the copper foil strips are each approximately two and one-half inches in width by thirty feet in length and are wrapped up upon one another to form a pair of spaced parallel capacitor plates having a large number of turns. Connection between the high voltage foil of capacitor 52 and the contact 56 for tube 54 is made by bringing the foil through a slot in plastic coil form 72 and running a conductive copper strip between form 72 and ferrite strip 70 to the aluminum ring 80. This ring is in contact with cylinder 68 and an end plate 86, both of which are conductive. By having cylinder 68 at the same voltage as the capacitor foil, corona discharge in this area is suppressed. A second plurality of spaced ferrite strips 74 are disposed around the outside of the capacitor 52 and a retaining cylinder 76 of plastic or other suitable dielectric material is disposed therearound to maintain the ferrite in place. The ferrite strips 70 and 74 substantially increase the output of a given spiral capacitor. A positioning ring 78 is disposed between an internal shoulder on the canister section 44 and the capacitor 52 assembly, as shown, to maintain the assembly in the proper axial position within the canister 36.

For corona suppression, a metallic corona shield ring 80 having the radially flared configuration illustrated in FIG. 2 is disposed around the interior of the capacitor 52 on the right-hand end thereof, as shown in FIG. 2, and, as previously mentioned, is maintained at a high voltage by connection to the capacitor foil. The suppressor ring 80 abuts the ferrite strips 70 on the internal diameter of the capacitor plate winding arrangement and bears against a cylindrical lead shield 82 which lies between the capacitor 52 and the X-ray tube 54. The lead shield 82 extends the full length of the tube 54, as shown, and terminates at the left-hand end adjacent an annular shield portion 84, as shown. The corona suppression apparatus further comprises the metallic end plate 86 disposed on the left-hand side of the capacitor 52, as shown in FIG. 2, and having the flared configuration shown. The corona suppressor plate 86 is threadedly engaged with the cantilevered high-voltage support ring 64, as shown.

Looking now to the interior of the X-ray tube 54, the high-voltage contact 56 in corona suppressor 86 engages a high-voltage contact rod 88 which is disposed within a plastic tube housing 90 so as to make contact with the left-hand end of a tungsten anode 92 by way of a contact plunger 94 and a contact spring 96 within the reentry portion of the X-ray tube envelope 55. The anode 92 is an elongated and pointed structure, as shown, and cooperates with a cathode assembly 98 hereinafter described in greater detail with reference to FIG. 6 to produce X-ray output pulses upon the application of a high-voltage pulse sequence to the anode by way of the contact 56. These X-ray pulses are directed through the lead collimator washer 100 and the fiberglass window 102 to the object under examination by way of the tube housing cap 16.

The tube housing 90 is threadedly engaged at the right-hand end with a retainer collar 104 which in turn is fixed to the end ring 58 so as to engage the cylindrical lead transformer shield 106 which is disposed within the interior volume of the transformer output unit 50. A lead shield ring 108 of cylindrical configuration is also disposed around the cylindrical path through which the X-ray beam travels on route to the device being examined for protection of the transformer unit 50. A plurality of feed-through terminal plugs 107 are disposed in the end ring 58 to bring leads from the transformer unit 50 to the external devices in the handle 22.

Figure 5:
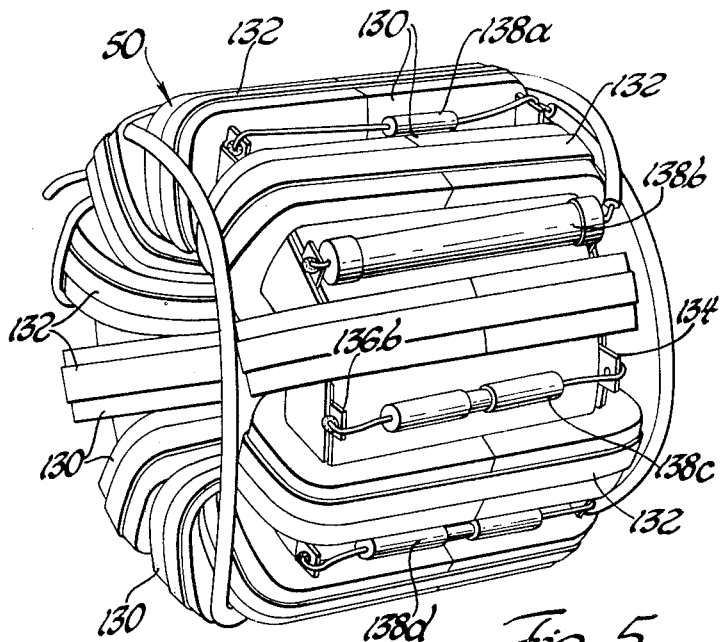
FIG. 5 is a perspective assembly drawing of the transformer and output unit of the device of FIGS. 1 and 2.

The details of the transformer unit 50 are partially apparent from the cross sectional view of FIG. 2 and are also apparent from the perspective view of FIG. 5 and the detailed description of the transformer output unit 50 will be given under the FIG. 5 heading found hereinafter.

FIGS. 3 AND 4

Looking now to FIGS. 3 and 4, the details of the spark gap trigger device which operates to apply the high-voltage pulses from the spiral capacitor 52 to the X-ray tube 54 will be described.

Figure 4:
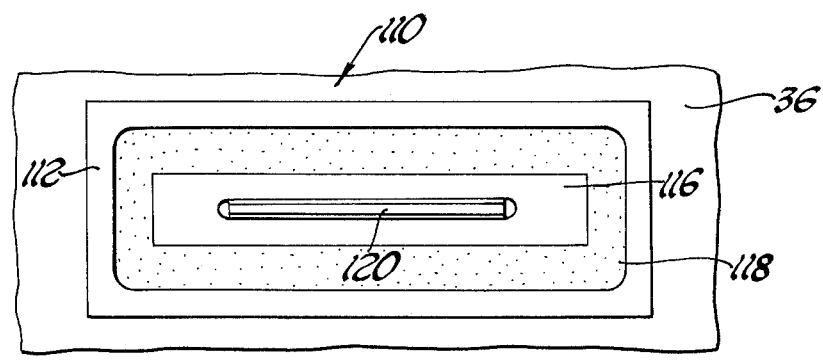
FIG. 4 is a plan view of the trigger device base electrode assembly.

As shown in FIG. 3, the canister 36 has the spark gap trigger device 110 mounted on the external surface thereof and the canister 36 is positioned within the housing 12 of FIG. 1 such that the spark gap trigger device occupies a corner volume which is otherwise wasted space within the housing because of its substantially square or rectangular cross-sectional configuration. The spark gap trigger device comprises an oblong rectangular bracket 112 of conductive metal, such as aluminum, a top plate 114 which is disposed on the oblong bracket 112 and secured thereto by fastener means, such as screws, an interior electrode support plate 116 which is maintained in position within an opening formed in the wall of the canister 36 by an insulative material 118, such as potting compound. The electrode plate 116 supports in the center thereof an elongated strip-like tungsten electrode 120. High voltage capacitor foil 122a is soldered to support plate 116 and is, thus, connected to electrode 120. The low voltage foil 122b of capacitor 52 is electrically connected to a contact rod 123 which abuts the canister 36 and, thus, is electrically connected to electrode 124 by way of bracket 112 and cover plate 114. The tungsten electrode 124 which is carried by cover plate 114 is parallel, but radially spaced in relationship with the electrode 120. Accordingly, the electrodes 120 and 124 are electrically insulated from one another by the air gap therebetween, this gap being such as to break down and provide a spark discharge thereacross whenever the voltage difference on the capacitor foil exceeds a predetermined magnitude. Note that a slot is provided in the cylinder 76 through which to bring the foils to the trigger device 110.

FIG. 5.

Looking now to FIG. 5 and also to FIG. 2, the details of the transformer output unit 50 will be described. This unit comprises fine and heavy transformer windings 126 and 127, respectively, disposed on a dielectric winding form 128 and surrounded by ten external cores 130. Each of the cores 130 comprises two C-shaped silicon-oriented steel core sections, each comprising a plurality of laminations to eliminate internally circulating currents. Each of the C-shaped core sections is secured together by means of a plated steel band 132 so as to form a closed core structure, thus, leaving the center of the transformer output unit 50 hollow to accommodate the X-ray tube 54. A plastic washer 133 is disposed between the cores 130 and the left-hand end of the canister section 46, as shown in FIG. 2 to hold the contact 51 previously described. The coil form 128 is preferably bounded at the right and left-hand ends thereof as seen in FIG. 2 by conductive connectors 134 and 136, respectively, so as to accommodate the electrical interconnection of a plurality of circuit components 138a through 138d between the transformer windings as hereinafter described in greater detail with reference to FIG. 8 and in such a way as to permit the components 138 to be positioned circumferentially between the cores 130. Accordingly, the transformer output unit 50 may be substantially prewired and premanufactured for disposition within the canister section 46 in the fashion of a module. Moreover, this construction contributes to the overall efficiency with which space is utilized in the device 10.

FIG. 6

Looking now to FIG. 6, the details of the cathode assembly 98 which forms part of the X-ray tube 54 will be described. In addition, a method for manufacturing the cathode assembly 98 of FIG. 6 will also be described.

Figure 6:
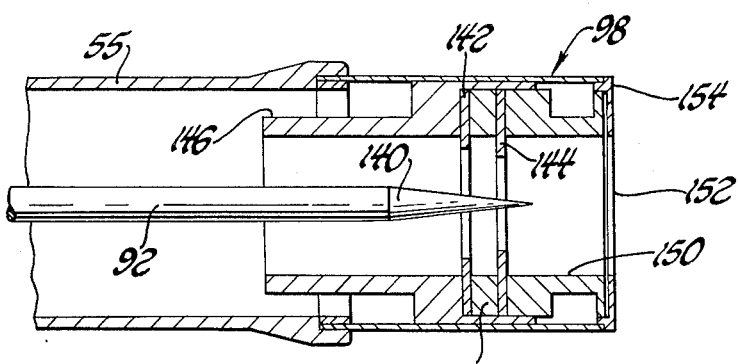
FIG. 6 is a side view in cross section of the X-ray tube cathode assembly.

As shown in FIG. 6, the pointed tungsten electrode 92 has a tapered portion 140 about which are spaced woven graphite fabric cathode rings 142 and 144. Rings 142 and 144 are held in place by means of an internally stepped cathode support tube 146 having a radial interior shoulder, a press fit spacer or separator 148 and a cathode clamp ring 150 which is also press fit within the tube 146. A nickel window 152 is held in place adjacent the right-hand end of the assembly 98 between the cathode clamp ring 150 and the end ring 154. It will be noted that the woven graphite fabric cathode rings 142 and 144 are provided with interior diameters which vary as between the two rings so as to maintain a substantially uniform spacing between the outer surface of the tapered portion 140 of the anode 92 and the interior diameters of the cathode rings.

The cathode assembly 98 is preferably manufactured by first cutting out a pair of wafers of graphite fabric, these two wafers having equal diameters as suggested in FIG. 6. The wafer which makes up ring 142 is first placed within the cathode assembly tube 146 and the separator 148 is press fit into place. A tool having an external diameter mating with the interior diameter of tube 146 and carrying a circular cutting blade on the end thereof is then driven through the tube. The blade passes through the wafer held between separator 148 and tube 146 to remove the circular center thereof. The wafer is preferably backed up by a block of Teflon or equivalent plastic to prevent tearing the delicate material thereof. The second wafer and the ring 150 are then put in place and a second tool with a smaller diameter circular blade is driven through the tube 146 to remove the center of graphite ring 144. Again a back up block is employed. The larger diameter hole of ring 142 is unaffected by the second cutting operation. Additional rings may be formed by a straightforward extension of this process, additional separators being required, of course.

The formation of the rings 142 and 144 within the assembly 98 reduces the amount of handling of the delicate graphite cloth and ensures a relatively precise shape and interior diameter thereof. This is of extreme importance inasmuch as the life of the X-ray tube is primarily a function of the durability of the cathode structure. In prior art devices where a plurality of needle-like structures are used in place of the more uniform and homogeneous graphite rings 142 and 144, it has been found that an extremely nonuniform discharge pattern occurs between the anode 92 and the various cathode needles, thus, causing some of the needles to be eroded away quite rapidly, such that the tube effectively wears out in a relatively short time. Moreover, the X-ray pattern which emerges from such a prior art tube is extremely nonuniform. Finally, the power level of the X-ray output tends to vary in the prior art devices from one pulse to the next whereas the uniform cathode ring arrangement shown in FIG. 6 tends to produce an extremely uniform output pattern and pulse level.

FIG. 7

Figure 7:
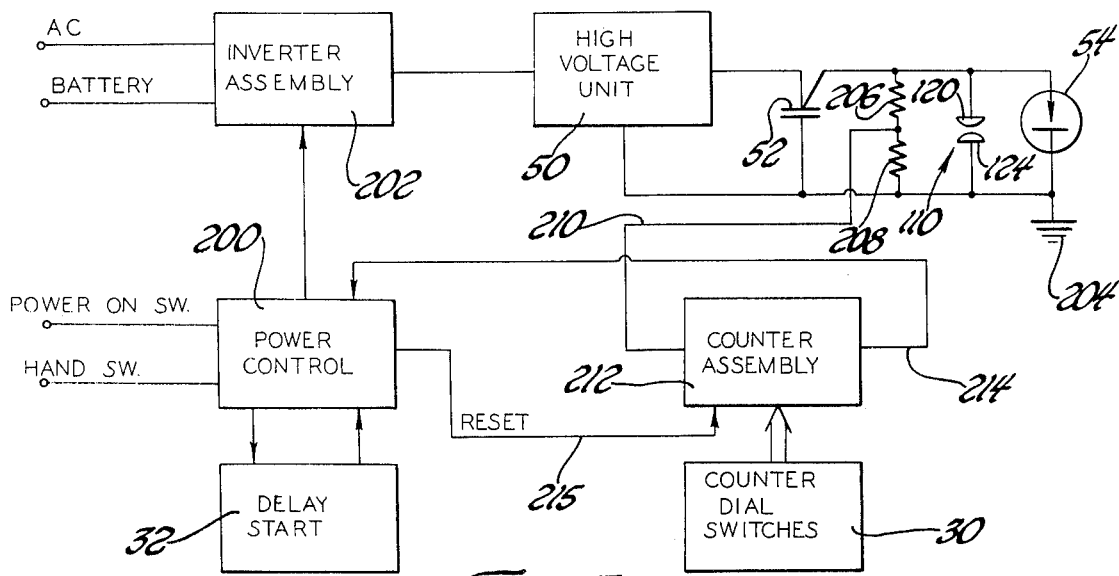
FIG. 7 is an electrical system block diagram for the device of FIGS. 1 and 2; and, FIG. 8 is a schematic diagram of an illustrative input stage for the device of FIGS. 1, 2, and 5.

Looking first to FIG. 7, a block diagram of the electrical arrangement of the components within the device 10 is shown. As shown in the block diagram, the circuit comprises a power control unit 200 which is essentially disposed within the handle 22 of FIG. 1 and which receives a first input from the switch 42, as shown, and a second input from the switch 28, as shown. When both switches are turned on, the power control unit 200 operates to provide either dc power from the battery cartridge 20 or ac power from an inverter assembly 202 to the high voltage transformer output unit 50. The power control unit 200 operates with or without a delay in accordance with the setting of the delay timer 32. The high-voltage transformer output unit 50 then provides a charging voltage to the high-voltage plate of the spiral capacitor 52 which is connected electrically in parallel with the electrodes 120 and 124 of the spark gap trigger device 110 and the anode and cathode of the X-ray tube 54. Whenever the voltage reaches the predetermined level, a discharge or arcing occurs between the electrodes 120 and 124, thus, to apply a high-voltage pulse to the X-ray tube 54. It will be noted that the cathode of the X-ray tube 54, the electrode 124, and one of the plates of the capacitor 52 are all connected to the system ground 204. A feedback signal is derived from the junction between resistors 206 and 208 and is fed by way of line 210 to the counter assembly 212. The counter is essentially a pulse counter and is set by the thumbwheel switches which form part of the unit 30 shown in FIG. 1.

Accordingly, one may set the unit or device 10 for any number of output X-ray pulses from one to ninety-nine, may further set a delay time of up to one minute or more by means of the delay timer 32 and thereafter depresses the hand switch 28 so as to cause a high voltage to be applied to the spiral capacitor 52. Once the capacitor 52 is charged up to a predetermined level, the arcing or discharge between the electrodes of the trigger device 110 occurs and applies a transient to the tube 54 to produce the X-ray output pulses. When the predetermined number of pulses has been generated, the feedback signal on line 210 applied to the counter assembly 212 causes a "stop" signal to be applied to the power control 200 by way of line 214, thus, terminating any further application of the high-voltage signal to the spiral capacitor 52. The counter 212 is reset via line 215 each time the switch 28 is depressed.

FIG. 8

Figure 8:
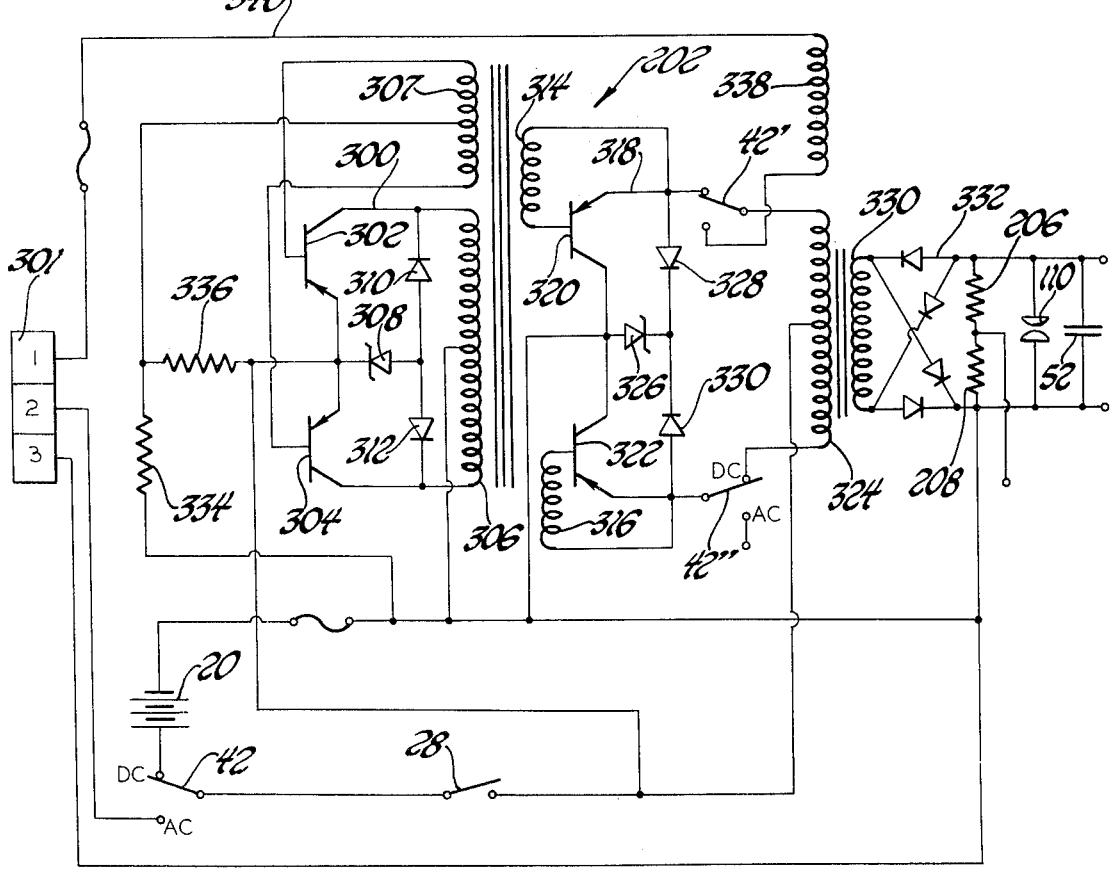

Looking now to the circuit of FIG. 8, the electrical details of the inverter assembly 202 as well as the nature of the windings 126 and 127 in the transformer output unit and the interrelation thereof with the feedback line trigger device and spiral capacitor are shown.

In FIG. 8, mode select switches 42, 42', and 42" are all capable of being positioned in each of the ac and dc positions so as to permit the device 10 to operate off of the battery cartridge 20 or directly from an ac power source through terminal block 301. When operated in the dc mode, the 28.8 volt output of battery cartridge 20 is connected to a first inverter stage 300 through resistors 334 and 336. The inverter stage 300 is a conventional push-pull converter comprising PNP-type transistors 302 and 304 having the collector electrodes thereof connected to opposite ends of a center-tapped primary winding 306. Voltage stability is provided by means of a Zener diode 308 having one electrode connected commonly to the emitters of transistors 302 and 304 and the other electrode connected through diodes 310 and 312 to the opposite ends of the transformer winding 306. The push-pull operation of the inverter stage 300 is provided by means of the inductive cross coupling which results from the center-tapped winding 307 the opposite ends of which are connected to the base or control electrodes of transistors 302 and 304.

Primary winding 306 drives secondary windings 314 and 316 which form part of second inverter stage 318 comprising transistors 320 and 322. The second stage 318 is similar to the first stage 300 and further comprises a precision Zener diode 326 and current-limiting diodes 328 and 330. The transistors 320 and 322 have the emitter electrodes thereof connected through the switches 42' and 42", respectively, to opposite ends of the center-tapped primary winding 324. It will be noted that the center tap of primary winding 324 is returned to the 28.8 volt battery cartridge 20 by way of the hand switch 28 as well as the mode select switch 42. wind 324 drives secondary winding 330 to provide the high-voltage signal which is applied through a diode inverter bridge 332 to the capacitor 52 and also to the electrodes 120 and 124 of the spark gap trigger device 110. The voltage divider resistors 206 and 208 which provide the feedback signal to the counter by way of line 210 are also shown in FIG. 8.

When the circuit of FIG. 8 is operated in the ac mode, switches 42, 42', and 42" are all set to the ac positions, thus, to apply ac power through the hand switch 28 directly to only the upper half of the primary winding 324. The ac signal is also applied via line 340 to the auxiliary winding 338 which effectively takes the place of the lower half of the primary winding 324 in the ac mode.

The windings 306, 307, 314, 316, 324, and 330 are all part of the windings represented by reference character 127 in the detailed cross-sectional view of FIG. 2. Winding 330 in FIG. 8 corresponds to winding 126 in FIG. 2. Moreover, the diode bridge components 332 as well as various other components in the inverter circuit of FIG. 8 may be disposed in the positions represented by the position of components 138 of FIG. 5.

In a practical embodiment of the invention, the circuit of FIG. 8 is capable of producing a rectified output of approximately 7 kilovolts thereby to charge the spiral capacitor 52. The transistors in the second stage 318 of the circuit of FIG. 8 are preferably high-power transistors capable of conducting 15 amperes or more. The primary winding 338 preferably comprises 250 turns of No. 27 wire, the upper and lower halves of the primary winding 24 comprise 65 turns each of No. 27 wire and the secondary winding 330 comprises 26,000 turns of No. 40 wire.

Additional detailed information regarding the theory of operation of a high-voltage spiral capacitor may be found in the Proceedings of the IEE, Volume 111, No. 4, Apr. 1964, pages 849 through 855, "Novel Principal of Transient High Voltage Generation", by Fitch and Howell.

It is to be understood that the invention has been described with reference to a specific embodiment thereof and various modifications, changes, additions, and rearrangements are possible within the scope of the art and, accordingly, the foregoing description is not to be construed in a limiting sense.

The embodiments of the invention in which an exclusive property or privilege is claimed are defined as follows:

1. In an X-ray source device, an X-ray emitting tube comprising: an envelope, an elongated anode having an emitting end tapering substantially to a point within said envelope and spaced therefrom, and a cathode spaced from said anode and comprising an annular disk of high resistance material disposed coaxially about and uniformly spaced from said emitting end point and in a plane which intersects the tapered end.

2. Apparatus as defined in claim 1 wherein said cathode disk is formed of a woven carbonaceous material.

3. Apparatus as defined in claim 1 wherein said cathode comprises an additional emitter disk coaxial with and spaced from said one disk, both of said disks lying in planes which intersect the anode in the area of the tapered end.

4. Apparatus as defined in claim 3 wherein the emitting end of said anode is substantially tapered to a point, the interior diameters of said emitter disks varying in accordance with the diameter of said anode in the plane of each disk to provide uniform radial spacing between the anode and disks along the taper thereof.

5. Apparatus as defined in claim 1 wherein said tube further comprises a cathode support assembly including a first hollow cylindrical support member having an end portion of increased diameter to define an annular interior shoulder, said emitter disk being disposed within said first support member and abutting said shoulder, and a second hollow cylindrical support member snugly fit within said end portion and maintaining said emitter disk in position.

6. Apparatus as defined in claim 1 wherein the annular disk has an outer diameter substantially corresponding to the inner diameter of the cylindrical support in said end portion, and an inner diameter which is slightly less than the inner diameter of the second support member such that only a minor portion of the radial dimension of the disk extends radially inwardly of the supports.

7. In an X-ray source device; an X-ray emitting tube comprising an envelope, an elongated anode having an emitting end tapering substantially to a point within said envelope and spaced therefrom, a cathode of woven carbonaceous material spaced from said anode and in the form of an annular disk disposed coaxially about and uniformly spaced from said emitting end point, first and second annular and axially adjacent support members, said disk being clamped between said support members, the inner diameter of the disk being slightly less than the inner diameters of the support members such that only a minor portion of the radial dimension of the disk extends freely radially inwardly of the support members, the major portion of the radial dimension of the disk being clamped between said support members.

\* \* \* \* \*